(12) United States Patent
Huang (10) Patent No.: US 11,450,703 B2
(45) Date of Patent: Sep. 20, 2022

(54) PHOTODETECTION APPARATUS AND PHOTODETECTION SENSOR USED THEREFOR

(71) Applicant: SHANGHAI HARVEST INTELLIGENCE TECHNOLOGY CO., LTD., Shanghai (CN)

(72) Inventor: Jiandong Huang, Shanghai (CN)

(73) Assignee: SHANGHAI HARVEST INTELLIGENCE TECHNOLOGY CO., LTD., Shanghai (CN)

( * ) Notice: Subject to any disclaimer, the term of this patent is extended or adjusted under 35 U.S.C. 154(b) by 143 days.

(21) Appl. No.: 16/758,014

(22) PCT Filed: Oct. 12, 2018

(86) PCT No.: PCT/CN2018/110084
§ 371 (c)(1),
(2) Date: Apr. 21, 2020

(87) PCT Pub. No.: WO2019/080729
PCT Pub. Date: May 2, 2019

(65) Prior Publication Data
US 2020/0321384 A1 Oct. 8, 2020

(30) Foreign Application Priority Data

Oct. 26, 2017 (CN) .......................... 201711015467.3

(51) Int. Cl.
*H01L 27/146* (2006.01)
*H01L 27/32* (2006.01)
*G06V 40/13* (2022.01)

(52) U.S. Cl.
CPC .... *H01L 27/14643* (2013.01); *G06V 40/1306* (2022.01); *H01L 27/14605* (2013.01);
(Continued)

(58) Field of Classification Search
CPC ....................... H01L 27/14643; H01L 27/146
See application file for complete search history.

(56) References Cited

U.S. PATENT DOCUMENTS

| | | | |
|---|---|---|---|
| 6,943,070 B2 | 9/2005 | Yang | |
| 2008/0073490 A1* | 3/2008 | Koide | G01J 1/44 250/214 C |

FOREIGN PATENT DOCUMENTS

| | | | |
|---|---|---|---|
| CN | 101393935 A | 3/2009 | |
| CN | 101556971 A | 10/2009 | |

(Continued)

OTHER PUBLICATIONS

International Search Report and Written Opinion received for PCT Patent Application No. PCT/CN2018/110084, dated Jan. 17, 2019, 8 pages.

*Primary Examiner* — Tony Ko
(74) *Attorney, Agent, or Firm* — Womble Bond Dickinson (US) LLP (57) ABSTRACT

A photodetection apparatus includes a display unit (102), a photodetection sensor (104) disposed beneath the display unit (102), a low refractive index adhesive (103) disposed between the display unit (102) and the photodetection sensor (104), and a main circuit board (106) disposed below the photodetection sensor (104). The display unit (102) includes a display member having a light transmittance greater than 3%. The photodetection sensor (104) includes a pixel thin film circuit (91) and a photodetection film (92) electrically connected to the pixel thin film circuit (91) and is adapted to receive an incident light and to convert the incident light into an optoelectronic signal. The low refractive index adhesive (103) has a refractive index smaller than that of the photodetection sensor (104).

21 Claims, 8 Drawing Sheets

(52) U.S. Cl.
CPC .... *H01L 27/14692* (2013.01); *H01L 27/3234* (2013.01); *H01L 27/3276* (2013.01)

(56) References Cited

FOREIGN PATENT DOCUMENTS

| | | |
|---|---|---|
| CN | 101359369 B | 5/2012 |
| CN | 204808361 U | 11/2015 |
| CN | 105608445 A | 5/2016 |
| CN | 102903721 B | 8/2016 |
| CN | 107145868 A | 9/2017 |

* cited by examiner

PHOTODETECTION APPARATUS AND PHOTODETECTION SENSOR USED THEREFOR

FIELD

The disclosure relates to a photodetection apparatus including a display unit, and more particularly to a photodetection apparatus including a display unit, a photodetection sensor and a low refractive index adhesive disposed therebetween.

BACKGROUND

A conventional display apparatus, such as a liquid crystal display (LCD) apparatus or an active matrix organic light emitting display (AMOLED) apparatus, includes a plurality of thin-film transistors (TFTs) and a plurality of pixels that are arranged in an array. Each of the pixels is driven by a respective one of the TFTs for displaying an image. Each of the TFTs is generally a metal-oxide-semiconductor field-effect transistor (MOSFET) that includes a semiconductor layer made from a semiconducting material such as amorphous silicon, crystalline silicon, indium gallium zinc oxide (IGZO), a nanocarbon material-mixed organic material, and combinations thereof. Since photodiodes may be manufactured using the above semiconducting material and since production equipment of the photodiodes is incorporable to production equipment of the TFTs array, a photodetection device including a plurality of photodiodes and a plurality of TFTs, both of which are arranged in an array, can be manufactured using the production equipment of the TFTs array. The photodetection device thus formed is applicable to different fields, such as an X-ray flat panel detector as disclosed in Chinese Invention Patent Publication No. CN 103829959 B, and an X-ray image sensing element and sensing module as disclosed in Chinese Invention Patent Publication No. CN 102903721 B.

Compared with the photodetection device made from conventional crystalline material, the semiconducting material for making the photodiodes of the conventional photodetection device has a band gap for absorbing substantial amount of visible light. However, the conventional photodetection device including the photodiodes made from the semiconducting material is susceptible to interference from environmental visible light and has a relatively low signal-to-noise ratio (SNR). Hence, the application of the photodetection device including the photodiodes made from the semiconducting material focuses primarily on the technical aspects of X-ray detection or sensing, such as the above-mentioned X-ray flat panel detector and X-ray image sensing element and sensing module. For alleviating the interference from the environmental visible light, the X-ray flat panel detector and the X-ray image sensing element and sensing module mentioned above include at least one fluorescent layer or flickering layer for converting an incident X-ray light, which has a relatively short wavelength and a relatively high collimation, to the visible light. The visible light subsequently emits on the photodiodes.

The integration of the photodetection device with the conventional display apparatus has been contemplated so as to realize the display apparatus with a photodetection function. However, due to limitations of a pixel aperture ratio of the conventional photodetection display apparatus, an image generated from the visible light that is being detected by the photodiodes is distorted because of optical diffraction. Besides, an incident light has to pass through multiple layers of the conventional photodetection display apparatus before being detected by the photodiodes. Thus, it is difficult to abstract useful optical signals from the environment inside the photodetection display apparatus, where the signal-to-noise ratio is relatively low and where electrical signals generated by the photodiodes that receives optical signals, coexist with sensing signals generated by a touch panel that receives touching signals. The technical difficulty in abstracting the useful optical signals is approximately equal to that of single-photon imaging. An original image generated by the electrical signals has to be resolved by reconstruction through an algorithm on the basis of an optic theory. In order to deal with the difficulty of abstracting optical signal, it is proposed that an optical reinforcing member is further disposed in the conventional photodetection display apparatus, or to dispose the photodiodes on a side of a display unit, such as those of a display module disclosed in Chinese Invention Patent Publication No. 101359369 B, so as to reconstruct the image through the light that is not vertically incident on the side of the display unit.

The aforesaid conventional photodetection device has relatively low photoelectric conversion efficiency, which is disadvantageous in terms of manufacturing a display apparatus with a large area of array-arranged thin film elements. There is plenty of room for improving the photoelectric conversion efficiency of the photodetection device that is integrated in the photodetection display apparatus.

SUMMARY

Therefore, an object of the disclosure is to provide a photodetection apparatus that can alleviate at least one of the drawbacks of the prior art.

According to an aspect of the disclosure, a photodetection apparatus includes a display unit, at least one photodetection sensor, a low refractive index adhesive, and a main circuit board.

The display unit includes a display member and an active thin film transistor array film electrically connected to the display member. The display member has a light transmittance greater than 3%.

The at least one photodetection sensor is disposed beneath the display unit and includes at least one pixel detection region arranged in m columns×n rows, in which m is not less than 1 and n is not less than 1. The at least one pixel detection region includes a pixel thin film circuit that includes at least one thin film transistor, and a photodetection film that is electrically connected to the pixel thin film circuit and that is adapted to receive an incident light and to convert the incident light into an optoelectronic signal.

The low refractive index adhesive is disposed between the display unit and the at least one photodetection sensor. The low refractive index adhesive has a refractive index smaller than that of the at least one photodetection sensor.

The main circuit board is disposed below the at least one photodetection sensor.

According to another aspect of the disclosure, a photodetection sensor adapted to be disposed beneath a display unit of a photodetection apparatus is provided. The photodetection sensor includes at least one pixel detection region arranged in m columns×n rows, in which m is not less than 1 and n is not less than 1. The at least one pixel detection region includes a pixel thin film circuit and a photodetection film.

The pixel thin film circuit includes at least one thin film transistor, and the photodetection film electrically connected to the pixel thin film circuit and adapted to receive an incident light and to convert the incident light into an optoelectronic signal. The photodetection film is selected from a photodiode and a photodetection thin film transistor.

BRIEF DESCRIPTION OF THE DRAWINGS

Other features and advantages of the disclosure will become apparent in the following detailed description of the embodiments with reference to the accompanying drawings, of which.

DETAILED DESCRIPTION

Before the disclosure is described in greater detail, it should be noted that where considered appropriate, reference numerals or terminal portions of reference numerals have been repeated among the figures to indicate corresponding or analogous elements, which may optionally have similar characteristics.

Figure 1:
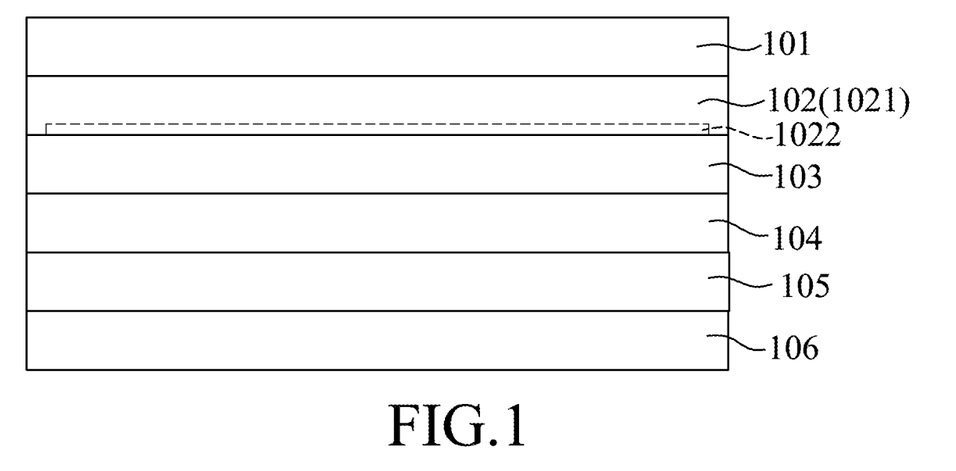
FIG. 1 is a schematic view illustrating an embodiment of a photodetection apparatus according to the disclosure.

Referring to FIG. 1, an embodiment of a photodetection apparatus according to the disclosure may be an electronic apparatus equipped with a touchable display screen, such as a portable apparatus (e.g. a cell phone, a tablet computer, a personal digital assistant (PDA), etc.), a personal computer, or an industrial computer. The photodetection apparatus includes a cover unit 101, a display unit 102, a low refractive index adhesive 103, at least one photodetection sensor 104, a flexible circuit board 105, and a main circuit board 106.

The cover unit 101 is disposed on a top of the display unit 102, and is selected from a touch screen and a glass covering plate so as to meet requirements of different end products adopting the cover unit 101.

The display unit 102 includes a display member 1021 and an active thin film transistor array film electrically connected to the display member 1021. The display member 1021 is selected from an active matrix organic light emitting diode (AMOLED) display member and an active matrix micro-light emitting diode (micro-LED) display member. The display member 1021 has a light transmittance greater than 3%, and thus, light flux passing through the display member 1021 is received by the at least one photodetection sensor 104 in an amount sufficient to implement photodetection function of the photodetection apparatus.

Figure 2:
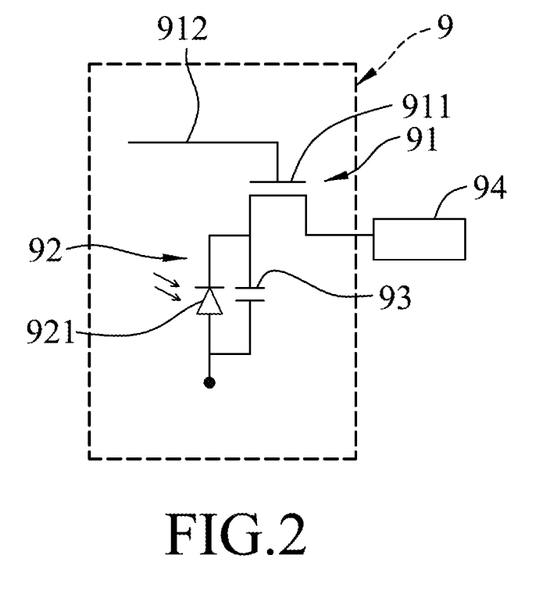
FIG. 2 is a circuit diagram illustrating a pixel detection region of at least one photodetection sensor of the embodiment of the photodetection apparatus.

Further referring to FIG. 2, the at least one photodetection sensor 104 is disposed beneath the display unit 102 and includes at least one pixel detection region 9 that is arranged in m columns×n rows, in which m is not less than 1 and n is not less than 1. The wavelength of the light that is detectable by the photodetection sensor 104 ranges from the visible light to the infrared light.

The at least one pixel detection region 9 includes a pixel thin film circuit 91, a photodetection film 92, and a capacitor 93. The pixel thin film circuit 91 includes at least one thin film transistor 911. The photodetection film 92 is electrically connected to the pixel thin film circuit 91 and is adapted to receive an incident light and to convert the incident light into an optoelectronic signal. The capacitor 93 is electrically connected to the photodetection film 92 in parallel.

The low refractive index adhesive 103 is disposed between the display unit 102 and the at least one photodetection sensor 104. The low refractive index adhesive 103 has a refractive index smaller than that of the at least one photodetection sensor 104. More specifically, the refractive index of the low refractive index adhesive 103 is less than 1.4. The low refractive index adhesive 103 not only securely interconnects the display unit 102 and the photodetection sensor 104, but also refracts the light passing therethrough. To be specific, the light entering the low refractive index adhesive 103 is refracted and enters the at least one photodetection sensor 104 along a direction that is close to a normal line of the at least one photodetection sensor 104 since the refractive index of the low refractive index adhesive 103 is smaller than that of a portion of the at least one photodetection sensor 104 which is directly attached to the low refractive index adhesive 103. Therefore, the light entering the at least one photodetection sensor 104 is increased and the light reflected at the interface between the low refractive index adhesive 103 and the at least one photodetection sensor 104 is accordingly decreased. The photoelectric conversion efficiency of the at least one photodetection sensor 104 can be thus enhanced. In this embodiment, the low refractive index adhesive 103 is an organic compound adhesive including a carbon-fluorine bond.

The at least one photodetection sensor 104 and the main circuit board 106 are connected to each other through the flexible circuit board 105. The flexible circuit board 105 includes a chip 94 for reading and identifying an image signal generated from the at least one photodetection sensor 104. In this embodiment, the chip 94 includes a fingerprint-reading chip portion for reading a fingerprint image signal and a fingerprint-identifying chip portion for processing the fingerprint image signal. The chip 94 may be commercially available from Analog Devices, Inc., and the model number is ADAS1256. The flexible circuit board 105 is also known as a flexible printed circuit (FPC) board. Compared to a conventional rigid circuit board made from a rigid resin, the flexible circuit board 105 has advantages of being thin, lightweight, high pattern density, less limitations on patterning, great flexibility, etc. Hence, arrangement of the flexible circuit board 105 allows the photodetection apparatus to be thin in size and light in weight to meet the market demand.

Referring back to FIG. 2, a circuit diagram of the at least one pixel detection region 9 of the at least one photodetection sensor 104 is illustrated. In this embodiment, the photodetection film 92 is taken as an example of the photodiode 921. When the at least one thin film transistor 911 of the pixel thin film circuit 91 of the at least one pixel detection region 9 is controlled to be turned on by a gate scanning line 912 and when the incident light enters the at least one photodetection sensor 104, the least one photodetection sensor 104 will detect the incident light. Thus, an optoelectronic signal in a voltage form that is obtained after conversion by the photodiode 921 and stored in the capacitor 93 is transmitted to the chip 94 of the flexible circuit board 105 by the at least one thin-film transistor 911. The aforementioned operation of the at least one pixel detection region 9 may be referred to the following articles: "Amorphous silicon image sensor arrays," M. J. Powell, I. D. French, J. R. Hughes, N. C. Bird, O. S. Davies, C. Glasse and J. E. Curran, Mater. Res. Soc. Symp. Proc., 1992, vol. 258, pp. 1127-1137; and "Design of Analog CMOS Integrated Circuits," B. Razavi, McGraw-Hill, 2000.

The main circuit board 106 is disposed below the at least one photodetection sensor 104. In this embodiment, the main circuit board 106 is a rigid circuit board and is electrically connected to the flexible circuit board 105.

Figure 8:
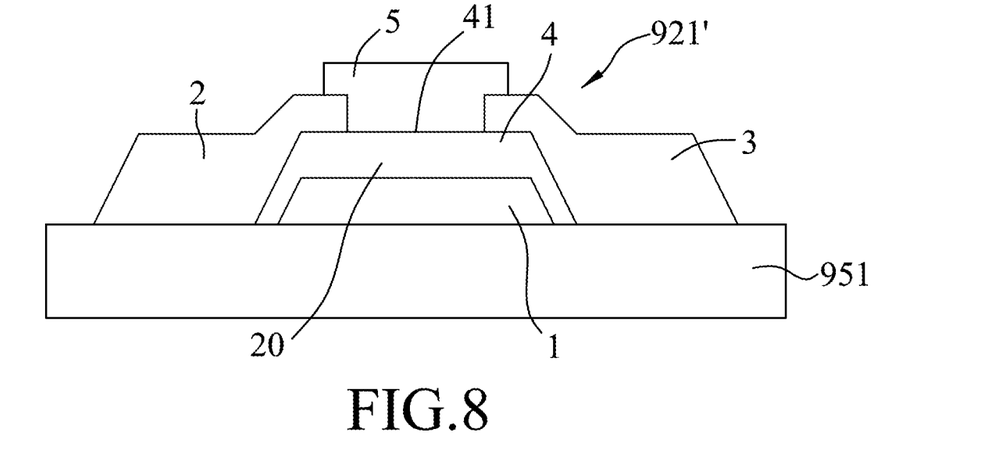
FIG. 8 is a schematic view illustrating a fifth embodiment of the photodetection film of the at least one photodetection sensor.

Referring to FIG. 8, the photodetection film 92 of the at least one pixel detection region 9 of the at least one photodetection sensor 104 may be a photodetection thin film transistor 921'.

Referring back to FIGS. 1 and 2, to be specific, the at least one photodetection sensor 104 of the photodetection apparatus of the disclosure includes a plurality of the pixel detection regions 9 that are arranged in the m columns×the n rows, in which both the m and the n are greater than 1. The display unit 102 may define a plurality of display photodetection regions 1022 that are arranged in p columns×q rows, in which both p and q are greater than 1. Each of the pixel detection regions 9 is disposed below and corresponding in position to a respective one of the display photodetection regions 1022 so as to detect a pixel. Thus, the pixel detection regions 9 can detect a plurality of pixels to form the image signal based on the optoelectronic signals converted by the photodetection films 92.

In this embodiment, the at least one photodetection sensor 104 includes a plurality of photodiodes 921 that are arranged in an array. The photodiodes 921 may be manufactured using production equipment of the thin film transistor array. For example, the photodiodes 921 may have a structure similar to that of a conventional photodiode disclosed in U.S. Pat. No. 6,943,070 B2 or Chinese Utility Model Publication No. CN 204808361 U. The manufacturing process of the at least one photodetection sensor 104 differs from that of the active thin film transistor array film in that the light sensing regions (not shown) of the photodiodes 921 replace pixel apertures of the active thin film transistor array film of the display member 1021. A substrate used in the manufacturing processes of both the at least one photodetection sensor 104 and the active thin film transistor array film may be made from glass or heat-resistant plastics, such as those disclosed in U.S. Pat. No. 6,943,070 B2.

Considering that the conventional photodiodes of the photodetection film has a relatively low signal-to-noise ratio (SNR) due to interference from environmental visible light or from reflection and refraction of visible light emitted from the display member, the SNR of the photodetection films 921 of the pixel detection regions 9 of the at least one photodetection sensor 104 of this embodiment has been improved. The improved photodetection films 921 of the pixel detection regions 9 of the at least one photodetection sensor 104 are able to detect an infrared light that is reflected from a user's body for subsequent identification process.

Figure 3:
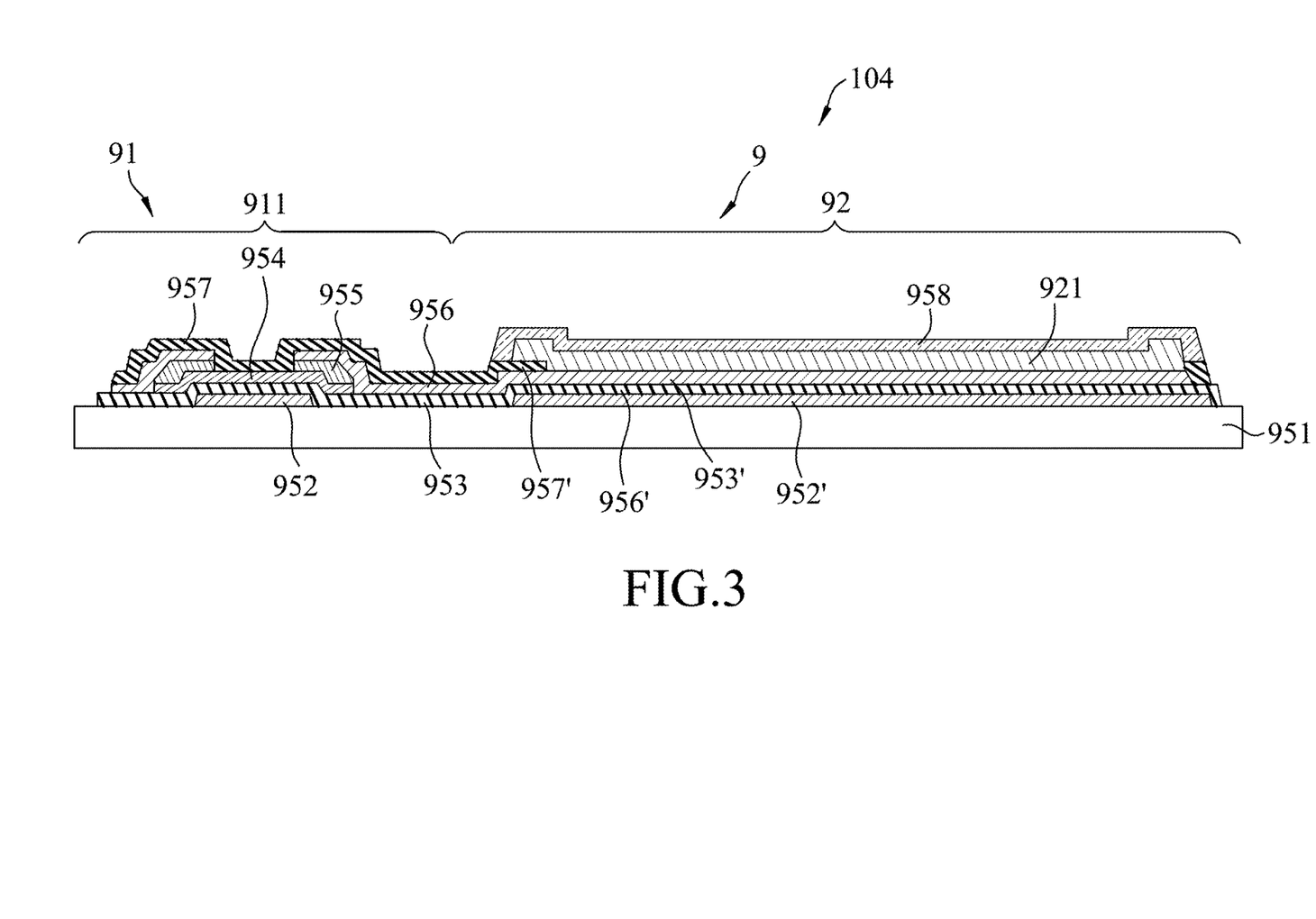
FIG. 3 is a schematic cross-sectional view illustrating the at least one photodetection sensor of the embodiment of the photodetection apparatus.

Referring to FIG. 3, the photodetection sensor 104 is formed on a substrate 951, which may be a glass sheet or a plastic sheet as mentioned above. The thin film transistor 911 of the pixel thin film circuit 91 of each of the pixel detection regions 9 includes a gate electrode layer 952 formed on the substrate 951, a first isolating layer 953 formed on the gate electrode layer 952, an intrinsic amorphous silicon channel layer 954 formed on the first isolating layer 953, an $n^+$-doped amorphous silicon (n-a-Si) source-and-drain contact terminal 955 formed on the intrinsic amorphous silicon channel layer 954, a source-and-drain metal electrode 956 formed on the $n^+$-doped amorphous silicon (n-a-Si) source-and-drain contact terminal 955, and a second isolating layer 957 formed on the source-and-drain metal electrode 956. The abovementioned components 951 to 957 are not of the essence of the present disclosure, and therefore will not be further elaborated.

Figure 4:
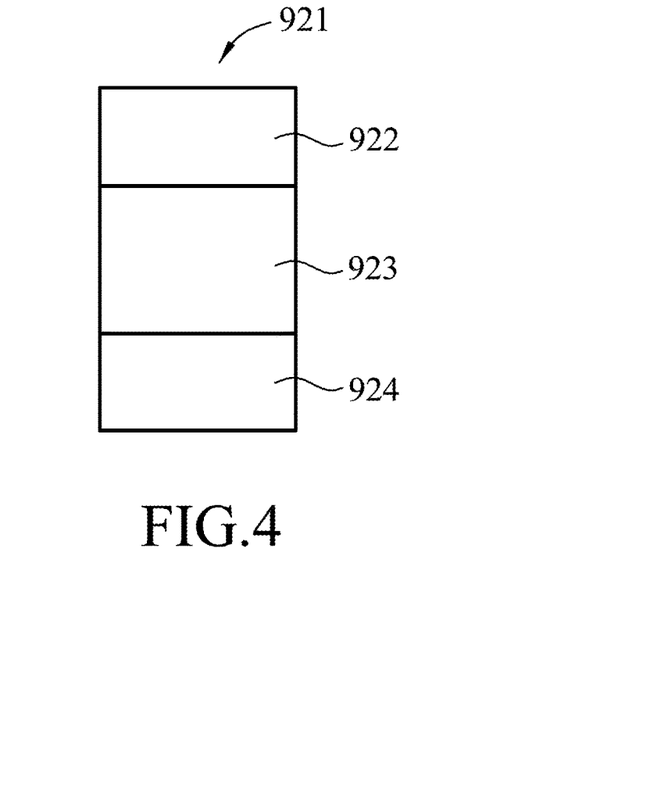
FIG. 4 is a schematic view illustrating a first embodiment of a photodetection film of the at least one photodetection sensor.

Referring to FIG. 4 in combination with FIG. 2, a first embodiment of the photodetection film 92 of the at least one photodetection sensor 104 is illustrated. The photodiode 921, which serves as the photodetection film 92 of each of the pixel photodetection regions 9 of the at least one photodetection sensor 104, includes an n-type semiconductor layer 924, an intrinsic semiconductor layer 923 disposed on the n-type semiconductor layer 924, and a p-type semiconductor layer 922 disposed on the intrinsic semiconductor layer 923. The intrinsic semiconductor layer 923 has a structure selected from an amorphous silicon structure, a microcrystalline silicon structure, and a non-crystalline silicon-germanium structure. The microcrystalline silicon structure has a crystallinity greater than 40% and a band gap less than 1.7 eV, and may be formed by mixing a silane and hydrogen gas using chemical vapor deposition (CVD). The non-crystalline silicon-germanium has a band gap less than 1.7 eV and may be formed by mixing a germane ($GeH_4$), hydrogen gas and a silane using the CVD.

More specifically, referring back to FIG. 3, the photodiode 921 of each of the pixel detection regions 9 further includes a gate electrode layer 952', a first isolating layer 953', a source-and-drain electrode layer 956', a second isolating layer 957', and a metal-oxide transparent electrode 958. In one form, for each of the pixel detection regions 9, the photodetection film 92 and the pixel thin film circuit are both formed on the substrate 951. The gate electrode layer 952 of the thin film transistor 911 of the pixel thin film circuit 91 and the gate electrode layer 952' of the photodiode 921 are formed in a same layer. The first isolating layer 953 of the thin film transistor 911 of the pixel thin film circuit 91 and the first isolating layer 953' of the photodiode 921 are formed in a same layer. The source-and-drain metal electrode 956 of the thin film transistor 911 of the pixel thin film circuit 91 and the source-and-drain electrode layer 956' of the photodiode 921 are formed in a same layer. The second isolating layer 957 of the thin film transistor 911 of the pixel thin film circuit 91 and the second isolating layer 957' of the photodiode 921 are formed in a same layer.

The band gap is an important physical parameter of the semiconducting material and is determined by the band structure of the semiconducting material, which is relevant to the crystal structure and binding properties of atoms, etc. At room temperature (300 K), the band gap of the germanium is 0.66 eV, and the band gap of the intrinsic semiconductor layer 923 of the above photodiode 921 is decreased when germanium is doped in saline. When the band gap of the intrinsic semiconductor layers 923 of the photodiodes 921 is less than 1.7 eV, the intrinsic semiconductor layers 923 of the photodiodes 921 can absorb the light having the wavelength ranging from the visible light region to the infrared light region (or near infrared light region). In this embodiment, by controlling the concentration of $GeH_4$, the photodiode 921 of each of the pixel photodetection regions 9 having one of the non-crystalline silicon-germanium structure and the microcrystalline silicon-germanium structure can absorb the light having an expanded wavelength ranging from 600 nm to 2000 nm.

Alternatively, the photodetection film 92 may include two of the photodiodes 921 that are stacked on each other (not shown). To be specific, an upper one of the photodiodes 921 is disposed on a lower one of the photodiodes 921. The upper one of the photodiodes 921 includes a p/i/n structure which includes the n-type semiconductor layer 924 that is disposed on the lower one of the photodiodes 921, the intrinsic semiconductor layer 923 that may have the amorphous silicon structure and that is disposed on the n-type semiconductor layer 924, and the p-type semiconductor layer 922 that is disposed on the intrinsic semiconductor layer 923. The lower one of the photodiodes 921 includes the p/i/n structure which includes the n-type semiconductor layer 924, the intrinsic semiconductor layer 923 that may have the microcrystalline structure, a polycrystalline structure or a compound doped with a material which can detect an expanded wavelength of the light and that is disposed on the n-type semiconductor layer 924, and the p-type semiconductor layer 922 that is disposed on the intrinsic semiconductor layer 923. The photodetection film 92 of each of the pixel photodetection regions 9 may have a structure of more than two of the photodiodes 921 that are stacked on one another.

Figure 5:
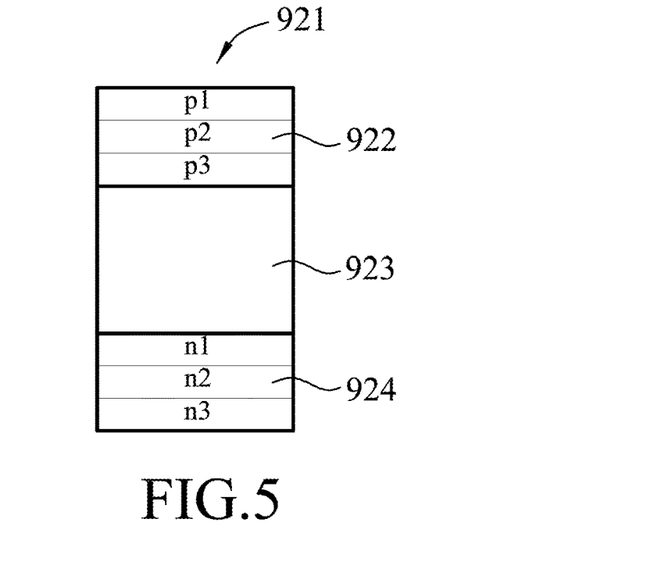
FIG. 5 is a schematic view illustrating a second embodiment of the photodetection film of the at least one photodetection sensor.

Referring to FIG. 5, a second embodiment of the photodetection film 921 of each of the pixel detection regions 9 is illustrated. In this embodiment, the p-type semiconductor layer 922 of the photodiode serving as the photodetection film 92 of each of the pixel photodetection regions 9 of the at least one photodetection sensor 104 includes a plurality of p-type semiconductor layered portions that are sequentially stacked on the intrinsic semiconductor layer 923.

Specifically, in this embodiment, the p-type semiconductor layer 922 includes three of the p-type semiconductor layered portions (p1, p2 and p3). The topmost one of the p-type semiconductor layered portions (p1) has a non-crystalline silicon structure and is heavily doped with the p-type dopant of borane (having a concentration of the p-type dopant of borane more than twice of the normal level), and the other ones of the p-type semiconductor layered portions (p2, p3) have the microcrystalline structure, and are normally doped with the p-type dopant of borane (having a concentration of the p-type dopant of borane within the normal level). By way of decreasing thicknesses of the other ones of the p-type semiconductor layered portions (p2, p3) relative to the topmost one of the p-type semiconductor layered portions (p1), the light absorbed by the p-type semiconductor layered portions (p2, p3) is thus decreased. Thus, the light entering into and absorbed by the intrinsic semiconductor layer 923 is increased so as to improve the photoelectric conversion efficiency of the photodetection film 921. In addition, since each of the other ones of the p-type semiconductor layered portions (p2, p3) has the concentration of the p-type dopant of borane within the normal level, deterioration of the built-in voltage of the photodiode 921 may be avoided due to the heavy doping of the topmost one of the p-type semiconductor layered portions (p1) with the p-type dopant of borane. The p-type semiconductor layer 922 may include more than three of the p-type semiconductor layered portions, and similar to the abovementioned configuration, the topmost one of the p-type semiconductor layered portions (p1) is heavily doped with the p-type dopant of borane while the other ones of the p-type semiconductor layered portions (p2, p3) have the concentration of the p-type dopant of borane within the normal level.

Similarly, the n-type semiconductor layer 924 of the photodiode 921 of each of the pixel photodetection regions 9 of the at least one photodetection sensor 104 includes a plurality of n-type semiconductor layered portions. In this embodiment, the n-type semiconductor layer 924 includes three of the n-type semiconductor layered portions (n3, n2, n1) that are stacked on one another. A bottommost one of the n-type semiconductor layered portions (n3), which is most distal to the intrinsic semiconductor layer 923, has a non-crystalline silicon structure and is heavily doped with the n-type dopant of phosphorus (having a concentration of the n-type dopant of phosphorus more than twice of the normal level), and the other ones of the n-type semiconductor layered portions (n2, n1) sequentially disposed on the bottommost n-type semiconductor layered portion (n3) have the microcrystalline structure, and are normally doped with the n-type dopant of phosphorus (having a concentration of the n-type dopant of phosphorus within the normal level). Byway of decreasing thicknesses of the other ones of the n-type semiconductor layered portions (n2, n1) relative to the bottommost one of the n-type semiconductor layered portion (n3), the light absorbed by the n-type semiconductor layer 924 is thus decreased. Thus, the light reflected by n-type semiconductor layer 924 and entering into and absorbed again by the intrinsic semiconductor layer 923 is increased so as to improve the photoelectric conversion efficiency of the photodetection film 921. In addition, since two of the n-type semiconductor layered portions (n2, n1) have the concentration of the n-type dopant of phosphorus within the normal level, deterioration of the built-in voltage of the photodiode 921 may be avoided due to the heavy doping of the bottommost one of the n-type semiconductor layered portions (n3) with the n-type dopant of borane. The n-type semiconductor layer 924 may include more than three of the n-type semiconductor layered portions, and similar to the abovementioned configuration, the bottommost one of the n-type semiconductor layered portions (n3) is heavily doped with the n-type dopant of borane, while the other ones of the n-type semiconductor layered portions (n1, n2) have the concentration of the p-type dopant of borane within the normal level.

Figure 6:
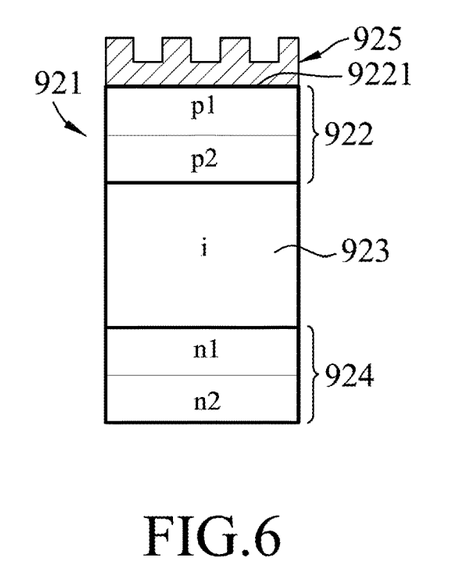
FIG. 6 is a schematic view illustrating a third embodiment of the photodetection film of the at least one photodetection sensor.

Referring to FIG. 6, a third embodiment of the photodetection film 921 of each of the pixel detection regions 9 is illustrated. The third embodiment is similar to the second embodiment except that the p-type semiconductor layer 922 of the photodiode 921 of each of the pixel detection regions 9 of the at least one photodetection sensor 104 includes two of the p-type semiconductor layered portions (p1, p2), and the n-type semiconductor layer 924 of the photodiode 921 of each of the pixel detection regions 9 of the at least one photodetection sensor 104 includes two of the n-type semiconductor layered portions (n1, n2). Furthermore, the photodiode 921 further includes a first optical film 925 that is immediately disposed on a top surface 9221 of the p-type semiconductor layer 922 for reducing a reflection rate of light from the top surface 9221 of the p-type semiconductor layer 922 or reducing a refraction angle of light in the p-type semiconductor layer 922. Since the refraction angle of the light in the p-type semiconductor layer 922 is reduced, the light passing through the p-type semiconductor layer 922 is close to a normal line of the top surface 9221 of the p-type semiconductor layer 922. Hence, light flux passing through the p-type semiconductor layer 922 and absorbed by the intrinsic semiconductor layer 923 is increased, and the photoelectric conversion efficiency of the photodiode 921 is thus improved. Specifically, the first optical film 925 may be formed on the top surface 9221 of the p-type semiconductor layer 922 defined by the topmost one of the p-type semiconductor layered portions (p1) of the p-type semiconductor layer 922.

In one form, the first optical film 925 of the photodiode 921 of each of the pixel detection regions 9 of the at least one photodetection sensor 104 has a structure selected from a photonic crystal structure with a refractive index varied periodically, a microlens array structure with a refractive index varied periodically, an incident light-scattered crystal structure with a refractive index varied non-periodically, and an incident light-diffused crystal structure with a refractive index varied non-periodically. The first optical film 925 has a refractive index smaller than that of the p-type semiconductor layer 922. When the light is refracted by an interface of the first optical film 925 and the p-type semiconductor layer 922, the angle of refraction is smaller than an angle of incidence and the light entering into the p-type semiconductor layer 922 is close to the normal line of the top surface 9221 of the p-type semiconductor layer 922.

Figure 7:
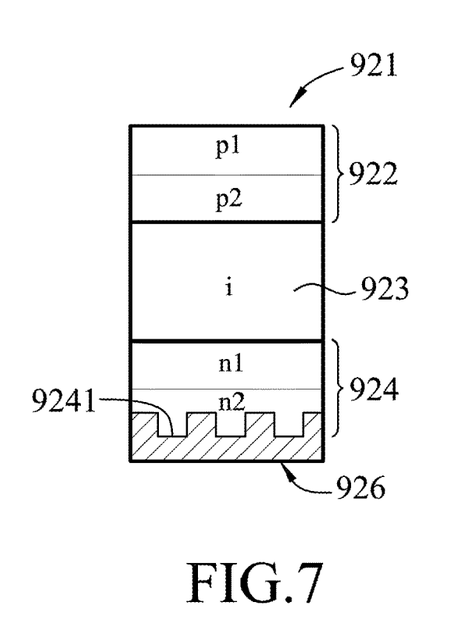
FIG. 7 is a schematic view illustrating a fourth embodiment of the photodetection film of the at least one photodetection sensor.

Referring to FIG. 7, a fourth embodiment of the photodetection film 921 of each of the pixel detection regions 9 is illustrated. The fourth embodiment is similar to the third embodiment except that the photodiode 921 further includes a second optical film 926 that is immediately disposed on a bottom surface 9241 of the n-type semiconductor layer 924 for reflecting light from the n-type semiconductor layer 924 to the intrinsic semiconductor layer 923. The second optical film 926 is used for reflection of light from the n-type semiconductor layer 924 to the intrinsic semiconductor layer 923 when the light passes through the n-type semiconductor layer 924, so that the light reflected by the second optical film 926 is absorbed again by the intrinsic semiconductor layer 923. More specifically, when the light passing through the p-type semiconductor layer 922, the intrinsic semiconductor layer 923 and the n-type semiconductor layer 924 is reflected by the second optical film 926, a portion of the reflected light is absorbed by the intrinsic semiconductor layer 923 again, and the other portion of the reflected light is reflected again by the second optical film 926 and then enters into the n-type semiconductor layer 924. Therefore, the light can be reflected by the second optical film 926 multiple times for increasing the absorption of the intrinsic semiconductor layer 923. Specifically, the second optical film 926 is immediately disposed on a bottom surface 9241 of the bottommost one of the n-type semiconductor layered portions (n2) of the n-type semiconductor layer 924.

The second optical film 926 has a structure selected from a photonic crystal structure with a refractive index varied periodically, an incident light-scattered crystal structure with a refractive index varied non-periodically, and an incident light-diffused crystal structure with a refractive index varied non-periodically. Hence, since the light passing through the n-type semiconductor layer 924 can be reflected by the second optical film 926, the reflected light can be absorbed again by the intrinsic semiconductor layer 923, and an optical signal generated from the light having the wavelength range that is able to be absorbed by the intrinsic semiconductor layer 923 is increased. Thus, the photoelectric current produced in the intrinsic semiconductor layer 923 is increased.

Referring to FIG. 8, a fifth embodiment of the photodetection film 921 of each of the pixel detection regions 9 is illustrated. In this embodiment, the photodetection film 92 of each of the pixel detection regions 9 of the at least one photodetection sensors 104 is a photodetection thin film transistor 921'. The photodetection thin film transistor 921' includes a gate electrode 1, a gate insulating layer 4, at least one drain terminal 2, at least one source terminal 3, and a light-absorbing semiconductor layer 5. The gate insulating layer 4 is surroundingly formed on the gate electrode 1. The at least one drain terminal 2 is disposed on the gate insulating layer 4 and is spaced apart from the gate electrode 1. The at least one source terminal 3 is disposed on the gate insulating layer 4 and is spaced apart from the gate electrode 1 and the at least one drain terminal 2. The light-absorbing semiconductor layer 5 is disposed on an exposed portion 41 of the gate insulating layer 4, which is exposed from the at least one drain terminal 2 and the at least one source terminal 3, and extends between the at least one drain terminal 2 and the at least one source terminal 3, so as to serve as a leakage current channel 20 extending between the at least one drain terminal 2 and the at least one source terminal 3. The photodetection thin film transistor 921' is an inverted-coplanar structure relative to the substrate 951 with the gate electrode 1 being proximal to the substrate 951, and the light-absorbing semiconductor layer 5 being distal from the substrate 951. Bottom surfaces of the at least one source terminal 3 and the at least one drain terminal 2 that are proximal to the substrate 951 are coplanar.

When the gate electrode 1 of the photodetection thin film transistor 921' is turned off without light illuminating the photodetection thin film transistor 921', electric current will not be generated in the leakage current channel 20 between the at least one source terminal 3 and the at least one drain terminal 2 of the photodetection thin film transistor 921' by means of an electric potential difference between the at least one drain terminal 2 and the at least one source terminal 3. However, when the gate electrode 1 of the photodetection thin film transistor 921' is turned off, and the light having a photon energy higher than that of a band gap of the light-absorbing semiconductor layer 5 illuminates the photodetection thin film transistor 921' in a direction extending from the light-absorbing semiconductor layer 5 toward the gate electrode 1, a leakage current will be generated in the leakage current channel 20 by means of the electric potential difference between the at least one drain terminal 2 and the at least one source terminal 3. In detail, by way of the light illumination, electrons of the light-absorbing semiconductor layer 5 in a ground state are excited to generate electron-hole pairs, and separation of the electron-hole pairs will be driven by the electric field between the at least one source terminal 3 and the at least one drain terminal 2 of the photodetection thin film transistor 921' so as to generate the leakage current. Since the light-absorbing semiconductor layer 5 is disposed to be a topmost and farthest layer of the photodetection thin film transistor 921' relative to the substrate 951, the light can illuminate the light-absorbing semiconductor layer 5 without passing through the gate electrode 1 and the gate insulating layer 4, and thus, excitation of electrons of the light-absorbing semiconductor layer 5 can be enhanced, and photovoltaic conversion efficiency of the photodetection thin film transistor 921' can be improved.

Figure 9:
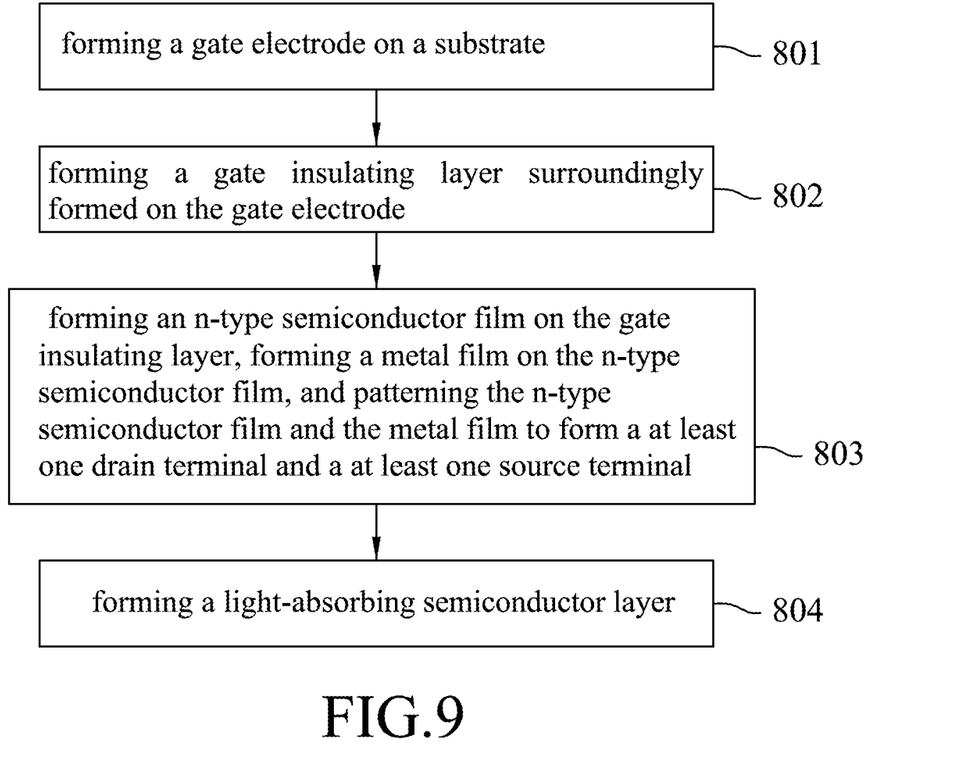
FIG. 9 is a flow chart illustrating a method of making the fifth embodiment of the photodetection film of the at least one photodetection sensor.

Further referring to FIG. 9, a method of making the thin film transistor 921' of the fifth embodiment of the photodetection film 92 is illustrated. The thin film transistor 921' is adapted to be formed on the substrate 951. The method includes Steps S801 to S804.

In Step S801, the gate electrode 1 is formed on the substrate 951 using magnetron sputtering. As mentioned above, the substrate 951 may be made of an inflexible material, such as glass, or a flexible material, such as the heat-resistant plastic, for example, polyimide.

In Step S802, a gate insulating layer 4 is surroundingly formed on the gate electrode 1 using CVD or magnetron sputtering.

In Step S803, an n-type semiconductor film is formed on the gate insulating layer 4 using CVD, a metal film is formed on the n-type semiconductor film using magnetron sputtering, and the n-type semiconductor film and the metal film are patterned to form the at least one drain terminal 2 and the at least one source terminal 3, which are spaced apart from each other, using photolithography and etching. By way of Step S803, an exposed portion 41 of the gate insulating layer 4, which is exposed from the at least one drain terminal 2 and the at least one source terminal 3, is formed.

In Step S804, the light-absorbing semiconductor layer 5 that extends between the at least one drain terminal 2 and the at least one source terminal 3 is formed on the exposed portion 41 of the gate insulating layer 4 using CVD.

For a conventional thin-film transistor, a structure for collecting the photoelectric current in the light-absorbing semiconductor layer 5 is not required and thus is not considered. In contrast, for the photodetection thin film transistor 921' of the disclosure, a structure for collecting the photoelectric current, i.e., the light-induced leakage current, is required. In detail, if a drift path of photoelectrons, which are generated by separation of the electron-hole pairs induced in the light-absorbing semiconductor layer 5 and are driven by the electric field between the at least one source terminal 3 and the at least one drain terminal 2, is too long, the excited electrons might have recombined with the holes or might be captured by dangling bonds present in the light-absorbing semiconductor layer 5 before reaching at the at least one source terminal 3 or the at least one drain terminal 2. Therefore, generation and output of the leakage current of the photodetection thin film transistor 921' may be deteriorated.

Figure 10:
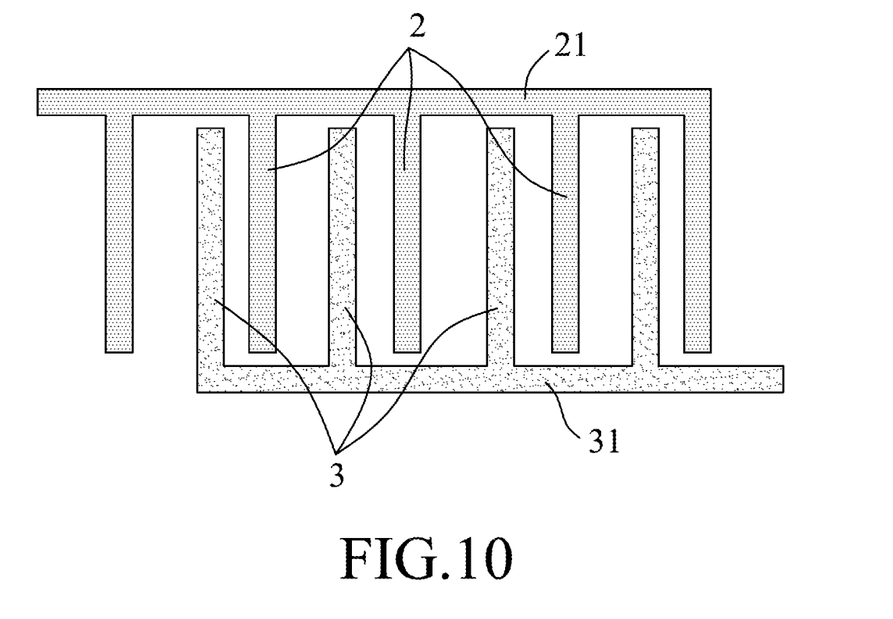
FIG. 10 is a top view illustrating a sixth embodiment of the photodetection film of the at least one photodetection sensor.
Figure 12:
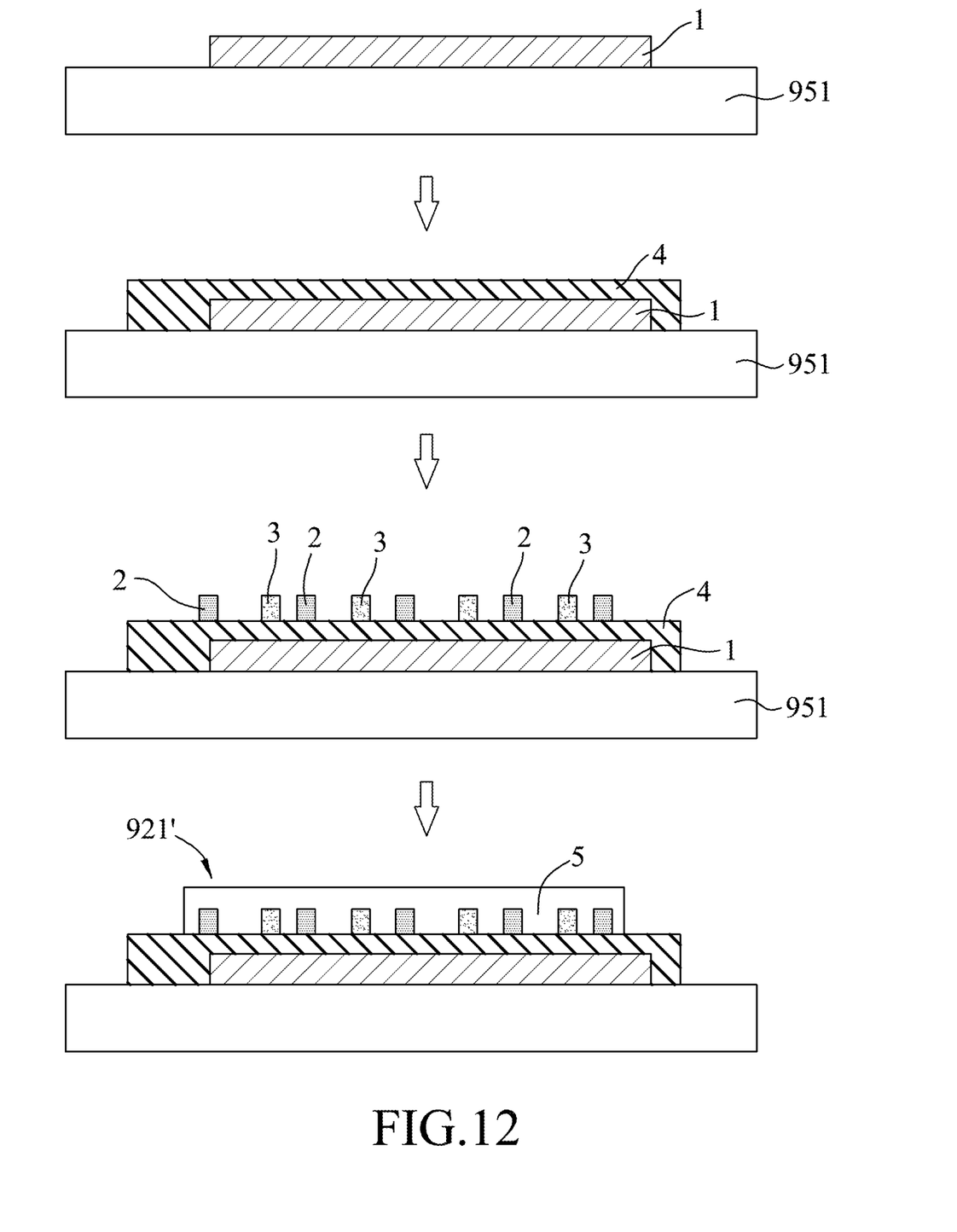
FIG. 12 is a schematic view illustrating consecutive steps of the method of making the sixth embodiment of the photodetection film of the at least one photodetection sensor.

Referring to FIG. 10, in order to improve the leakage current output, a sixth embodiment of the photodetection film 92 of the pixel detection regions of the at least one photodetection sensor 104 according to the disclosure is proposed. In this embodiment, the photodetection film 92 is the photodetection thin film transistor 921' (as shown in FIG. 12). The photodetection thin film transistor 921' includes a plurality of the drain terminals 2 that are spaced apart from each other and that are electrically connected in parallel, and a plurality of the source terminals 3 that are spaced apart from each other and that are electrically connected in parallel. The drain terminals 2 and the source terminals 3 are separately and alternately arranged on the gate insulating layer 4. The light-absorbing semiconductor layer 5 is disposed on the exposed portion 41 of the gate insulating layer 4 and is exposed among the drain terminals 2 and the source terminals 3 and extends among the drain terminals 2 and the source terminals 3. More specifically, each of the drain terminals 2 and source terminals 3 is directly formed on the gate insulating layer 4. The photodetection thin film transistor 921' may further include a drain connecting portion 21 and a source connecting portion 31. In each of the pixel detection regions 9 (as shown in FIG. 3), each of the drain terminals 2 is connected to the drain connecting portion 21 so that the drain terminals 2 are electrically connected in parallel. In each of the pixel detection regions 9, each of the source terminals 3 is connected to the source connecting portion 31 so that the source terminals 3 are electrically connected in parallel. A distance between one of the source terminals 3 and an adjacent one of the drain terminals 2 is smaller than the drift path of the photoelectrons, which is an average moving distance of the photoelectrons, before the photoelectrons recombine with the holes in the light-absorbing semiconductor layer 5. Therefore, undesired recombination of electron-hole pairs can be alleviated so as to enhance the leakage current generated in the leakage current channel 20 and the photosensitivity of the photodetection thin film transistor 921'.

Figure 11:
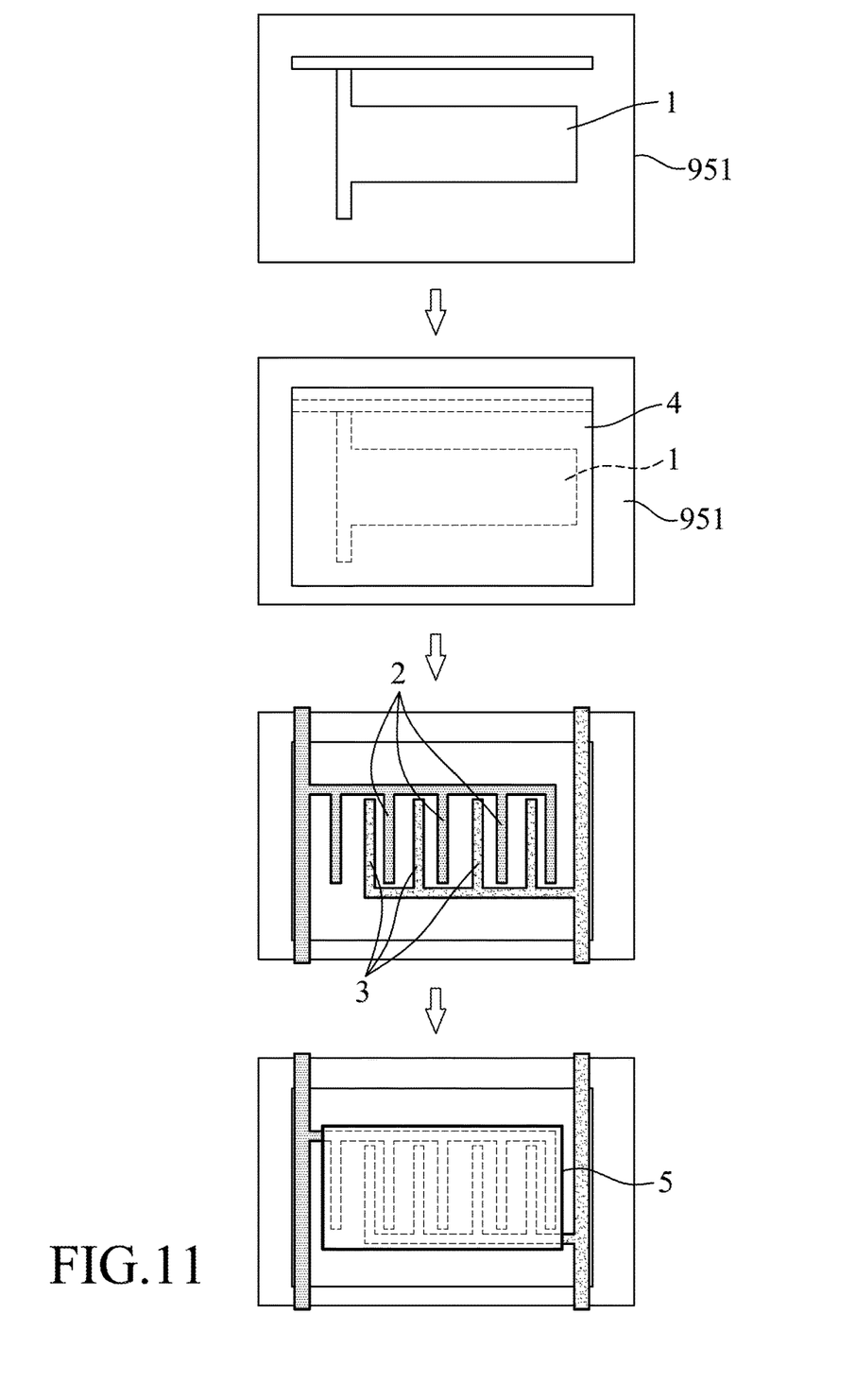
FIG. 11 is a schematically top view illustrating consecutive steps of a method of making the sixth embodiment of the photodetection film of the at least one photodetection sensor.

Referring to FIGS. 11-12, a method of making the photodetection thin film transistor 921' of the sixth embodiment of the photodetection film 92 is illustrated. The method of making the sixth embodiment of the photodetection film 92 is similar to that of the fifth embodiment of the photodetection thin film transistor 921' except that in Step S803, the patterning of the n-type semiconductor film (not shown) and the metal film (not shown) includes forming the drain terminals 2 that are spaced apart from each other and that are electrically connected in parallel, and the source terminals 3 that are spaced apart from each other and that are electrically connected in parallel, such that the drain terminals 2 and the source terminals 3 are spaced apart from one another and are alternately arranged on the gate insulating layer 4.

It is noted that in certain embodiments, the at least one photodetection sensor 104 may be operated either in a photodetection state or a light-emitting state. More specifically, when the at least one photodetection sensor 104 is operated in the photodetection state, the at least one photodetection sensor 104 is able to detect the light reflected from a detected portion of a user, such as a fingerprint, an eyeball, or an iris of the user. When the at least one photodetection sensor 104 is operated in the light-emitting state, the least one photodetection sensor 104 emits the light (e.g. infrared light) to serve as a light source. To be specific, the at least one photodetection sensor 104 may be switched to be operated in the photodetection state and the light-emitting state alternately, in a predetermined frequency (also in a predetermined period). In practical use, when the photodetection film 92 is the photodiode 921, an external bias (a forward bias, a zero bias or a reverse bias) through the at least one thin film transistor 911 will be applied to the photodiode 921 of the pixel thin film circuit 91 to drive the photodiode 921, so that the infrared-emitting and the photodetection functions of the at least one photodetection sensor 104 are being carried out.

To be specific, the external bias, i.e., the forward bias, the zero bias or the reverse bias may be alternately applied to the photodiode 921 to drive the photodiode 921 to perform light emission or light detection. In a first period, when the photodiodes 921 of the pixel detecting regions 9 are infrared detection diodes arranged in 10 rows and the forward bias is applied to the photodiodes 921, the photodiodes 921 of the pixel detecting regions 9 will emit infrared light. Subsequently, in a second period, when the zero bias or the reverse bias is applied to the photodiodes 921, the pixel detecting regions 9 will detect the infrared light that is reflected by the detected portion of the user (e.g. the user's eyeball) so that the reflected infrared light is converted into the optoelectronic signals to subsequently form the image signal. Next, in a third period, the forward bias is again applied to the photodiodes 921, and the photodiodes 921 of the pixel detecting regions 9 will emit infrared light again. The predetermined frequency may be adjusted based on actual use. In certain embodiments, each of the periods may be determined based on the time required for formation of the image signal from the optoelectronic signals that are transmitted by the thin film transistors and read by the chip 94.

In certain embodiments, the photodetection apparatus includes a plurality of the photodetection sensors 104. The display unit 102 defines a plurality of the display photodetection regions 107. Each of the photodetection sensors 104 is disposed below and corresponds in position to a respective one of the display photodetection regions 107.

The photodetection apparatus may further include a storage medium (not shown) that stores a computer program, and a processer (not shown) that is used for controlling the execution of the computer program stored in the storage medium. For instance, when the photodetection apparatus is used for identifying fingerprint, the pixel thin film circuit 91 may drive the at least one photodetection sensor 104 to be turned on when a turn-on signal is received from the processor, or may drive the at least one photodetection sensor 104 to be turned off when a turn-off signal is received from the processor.

When the number of the display photodetection regions 1022 of the display unit 102 and the number of the photodetection sensors 104 are respectively exemplified to be two, the display photodetection regions 1022 may be respectively located on top and bottom of the display unit 102, or may be respectively located at left and right sides of the display unit 102. More specifically, each of the photodetection sensors 104 is disposed beneath a respective one of the display photodetection regions 1022. The photodetection sensors 104 are turned on and turned off respectively, by the turn-on and turn-off signals inputted by the user. In one form, the display photodetection regions 1022 cooperatively cover the entire area of the display unit 102, so that all of the light passing through the display photodetection regions 1022 of the display unit 102 can be absorbed by the photodetection sensors 104. The photodetection sensors 104 may be controlled in such a manner that one of the photodetection sensors 104 is turned on and the other one of the photodetection sensors 104 is turned off.

To sum up, by virtue of the light transmittance of the display unit 102 being greater than 3%, the light flux passing through the display unit 102 is relatively large, and thus the light passing through the display unit 102 can be absorbed by the at least one photodetection sensor 104 so as to perform the photodetection function. Moreover, by virtue of the design of the refractive index of the low refractive index adhesive 103 being less than 1.4, the at least one photodetection sensor 104 can be securely connected to a bottom surface of the display unit 102. In addition, since the light passing through the display unit 102 and the low refractive index adhesive 103 and entering into the at least one photodetection sensor 104 can be close to the normal line of the at least one photodetection sensor 104, when the light reflected by the at least one photodetection sensor 104 is decreased, the light entering into the at least one photodetection sensor 104 will be increased. Hence, the photoelectric conversion efficiency of the photodetection sensor 104 can be enhanced. Furthermore, with inclusion of the flexible circuit board 105, the thickness of the photodetection apparatus can be reduced.

In the description above, for the purposes of explanation, numerous specific details have been set forth in order to provide a thorough understanding of the embodiments. It will be apparent, however, to one skilled in the art, that one or more other embodiments may be practiced without some of these specific details. It should also be appreciated that reference throughout this specification to "one embodiment," "an embodiment," an embodiment with an indication of an ordinal number and so forth means that a particular feature, structure, or characteristic may be included in the practice of the disclosure. It should be further appreciated that in the description, various features are sometimes grouped together in a single embodiment, figure, or description thereof for the purpose of streamlining the disclosure and aiding in the understanding of various inventive aspects, and that one or more features or specific details from one embodiment may be practiced together with one or more features or specific details from another embodiment, where appropriate, in the practice of the disclosure.

While the disclosure has been described in connection with what is are considered the exemplary embodiments, it is understood that this disclosure is not limited to the disclosed embodiments but is intended to cover various arrangements included within the spirit and scope of the broadest interpretation so as to encompass all such modifications and equivalent arrangements.

What is claimed is:

1. A photodetection apparatus, comprising: a display unit including a display member and an active thin film transistor array film electrically connected to said display member, said display member having a light transmittance greater than 3%;
    at least one photodetection sensor disposed beneath said display unit and including at least one pixel detection region arranged in m columns×n rows, in which m is not less than 1 and n is not less than 1, said at least one pixel detection region including a pixel thin film circuit that includes at least one thin film transistor, and a photodetection film that is electrically connected to said pixel thin film circuit and that is adapted to receive an incident light and to convert the incident light into an optoelectronic signal;
    a low refractive index adhesive disposed between said display unit and said at least one photodetection sensor, said low refractive index adhesive having a refractive index smaller than that of said at least one photodetection sensor; and
    a main circuit board disposed below said at least one photodetection sensor.

2. The photodetection apparatus of claim 1, wherein the refractive index of said low refractive index adhesive is less than 1.4.

3. The photodetection apparatus of claim 1, wherein said photodetection film is selected from a photodiode and a photodetection thin film transistor.

4. The photodetection apparatus of claim 3, wherein said photodiode including an n-type semiconductor layer, an intrinsic semiconductor layer disposed on said n-type semiconductor layer, and a p-type semiconductor layer disposed on said intrinsic semiconductor layer, said intrinsic semiconductor layer having a structure selected from an amorphous silicon structure, a microcrystalline silicon structure, and a non-crystalline silicon-germanium structure.

5. The photodetection apparatus of claim 4, wherein the microcrystalline silicon structure has a crystallinity greater than 40% and has a band gap less than 1.7 eV.

6. The photodetection apparatus of claim 4, wherein the non-crystalline silicon-germanium structure has a band gap less than 1.7 eV.

7. The photodetection apparatus of claim 4, wherein said photodiode further includes a first optical film that is immediately disposed on a top surface of said p-type semiconductor layer for reducing a reflection rate of light from said top surface of said p-type semiconductor layer or reducing a refraction angle of light in said p-type semiconductor layer.

8. The photodetection apparatus of claim 4, wherein said photodiode further includes a second optical film that is immediately disposed on a bottom surface of said n-type semiconductor layer for reflection of light from said n-type semiconductor layer to said intrinsic semiconductor layer.

9. The photodetection apparatus of claim 3, wherein said photodetection thin film transistor including
 a gate electrode,
 a gate insulating layer that is surroundingly formed on said gate electrode,
 at least one drain terminal that is disposed on said gate insulating layer and that is spaced apart from said gate electrode,
 at least one source terminal that is disposed on said gate insulating layer and that is spaced apart from said gate electrode and said at least one drain terminal, and
 a light-absorbing semiconductor layer that is disposed on an exposed portion of said gate insulating layer exposed from said at least one drain terminal and said at least one source terminal and that extends between said at least one drain terminal and said at least one source terminal so as to serve as a leakage current channel between said at least one drain terminal and said at least one source terminal.

10. The photodetection apparatus of claim 9, wherein said photodetection thin film transistor includes a plurality of said drain terminals that are spaced apart from each other and that are electrically connected in parallel and a plurality of said source terminals that are spaced apart from each other and that are electrically connected in parallel, said drain terminals and said source terminals being separately and alternately arranged on said gate insulating layer, said light-absorbing semiconductor layer being disposed on the exposed portion of said gate insulating layer exposed among said drain terminals and said source terminals and extending among said drain terminals and said source terminals.

11. The photodetection apparatus of claim 1, wherein said photodetection apparatus includes a plurality of said photodetection sensors, said display unit defining a plurality of display photodetection regions, each of said photodetection sensors being disposed below and corresponding in position to a respective one of said display photodetection regions.

12. The photodetection apparatus of claim 1, further comprising a cover unit that is disposed on said display unit and that is selected from a touch screen and a glass covering plate.

13. The photodetection apparatus of claim 1, further comprising a flexible circuit board connected to said at least one photodetection sensor and said main circuit board, said flexible circuit board including a chip for reading and identifying an image signal generated from said photodetection sensor.

14. The photodetection apparatus of claim 1, wherein said display member is selected from an active matrix organic light emitting diode (OLED) display member and an active matrix micro-light emitting diode (micro-LED) display member.

15. A photodetection sensor adapted to be disposed beneath a display unit of a photodetection apparatus, said photodetection sensor comprising at least one pixel detection region arranged in m columns×n rows, in which m is not less than 1 and n is not less than 1, said at least one pixel detection region including
 a pixel thin film circuit that includes at least one thin film transistor, and
 a photodetection film that is electrically connected to said pixel thin film circuit and that is adapted to receive an incident light and to convert the incident light into an optoelectronic signal, said photodetection film being selected from a photodiode and a photodetection thin film transistor,
 wherein said photodiode including an n-type semiconductor layer, an intrinsic semiconductor layer disposed on said n-type semiconductor layer, and a p-type semiconductor layer disposed on said intrinsic semiconductor layer, said intrinsic semiconductor layer having a structure selected from an amorphous silicon structure, a microcrystalline silicon structure, and a non-crystalline silicon-germanium structure.

16. The photodetection sensor of claim 15, wherein the microcrystalline silicon structure has a crystallinity greater than 40% and has a band gap less than 1.7 eV.

17. The photodetection sensor of claim 15, wherein the non-crystalline silicon-germanium structure has a band gap less than 1.7 eV.

18. The photodetection sensor of claim 15, wherein said photodiode further includes a first optical film that is immediately disposed on a top surface of said p-type semiconductor layer for reducing a reflection rate of light from said top surface of said p-type semiconductor layer or reducing a refraction angle of light in said p-type semiconductor layer.

19. The photodetection sensor of claim 15, wherein said photodiode further includes a second optical film that is immediately disposed on a bottom surface of said n-type semiconductor layer for reflection of light from said n-type semiconductor layer to said intrinsic semiconductor layer.

20. A photodetection sensor adapted to be disposed beneath a display unit of a photodetection apparatus, said photodetection sensor comprising at least one pixel detection region arranged in m columns×n rows, in which m is not less than 1 and n is not less than 1, said at least one pixel detection region including
 a pixel thin film circuit that includes at least one thin film transistor, and
 a photodetection film that is electrically connected to said pixel thin film circuit and that is adapted to receive an incident light and to convert the incident light into an optoelectronic signal, said photodetection film being selected from a photodiode and a photodetection thin film transistor,
 wherein said photodetection thin film transistor including
 a gate electrode,
 a gate insulating layer that is surroundingly formed on said gate electrode,
 at least one drain terminal that is disposed on said gate insulating layer and that is spaced apart from said gate electrode,
 at least one source terminal that is disposed on said gate insulating layer and that is spaced apart from said gate electrode and said at least one drain terminal, and a light-absorbing semiconductor layer that is disposed on an exposed portion of said gate insulating layer exposed from said at least one drain terminal and said at least one source terminal and that extends between said at least one drain terminal and said at least one source terminal so as to serve as a leakage current channel between said at least one drain terminal and said at least one source terminal.

21. The photodetection sensor of claim 20, wherein said photodetection thin film transistor includes a plurality of said drain terminals that are spaced apart from each other and that are electrically connected in parallel and a plurality of said source terminals that are spaced apart from each other and that are electrically connected in parallel, said drain terminals and said source terminals being separately and alternately arranged on said gate insulating layer, said light-absorbing semiconductor layer being disposed on the exposed portion of said gate insulating layer exposed among said drain terminals and said source terminals and extending among said drain terminals and said source terminals.

* * * * *